(12) United States Patent
Pillarisetty et al.

(10) Patent No.: US 8,030,163 B2
(45) Date of Patent: Oct. 4, 2011

(54) REDUCING EXTERNAL RESISTANCE OF A MULTI-GATE DEVICE USING SPACER PROCESSING TECHNIQUES

(75) Inventors: Ravi Pillarisetty, Portland, OR (US); Uday Shah, Portland, OR (US); Brian S. Doyle, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 388 days.

(21) Appl. No.: 11/964,593

(22) Filed: Dec. 26, 2007

(65) Prior Publication Data

US 2009/0166741 A1  Jul. 2, 2009

(51) Int. Cl.
*H01L 21/336* (2006.01)
(52) U.S. Cl. .. 438/283; 438/157; 438/300; 257/E21.421
(58) Field of Classification Search .................. 438/157, 438/183, 283, 300; 257/E21.421, E21.455, 257/E21.623, E21.637
See application file for complete search history.

(56) References Cited

U.S. PATENT DOCUMENTS

| | | | |
|---|---|---|---|
| 6,617,209 B1 | 9/2003 | Arghavani et al. | |
| 6,617,210 B1 | 9/2003 | Chau et al. | |
| 6,653,700 B2 | 11/2003 | Chau et al. | |
| 6,696,327 B1 | 2/2004 | Chau et al. | |
| 6,696,345 B2 | 2/2004 | Chau et al. | |
| 6,713,358 B1 | 3/2004 | Chau et al. | |
| 6,812,086 B2 | 11/2004 | Murthy et al. | |
| 6,825,506 B2 | 11/2004 | Jin et al. | |
| 6,858,478 B2 | 2/2005 | Chau et al. | |
| 6,887,800 B1 | 5/2005 | Metz et al. | |
| 6,890,807 B2 | 5/2005 | Chau et al. | |
| 6,893,927 B1 | 5/2005 | Shah et al. | |
| 6,897,134 B2 | 5/2005 | Chau et al. | |
| 6,914,295 B2 | 7/2005 | Chau et al. | |
| 6,933,589 B2 | 8/2005 | Murthy et al. | |
| 6,939,815 B2 | 9/2005 | Brask et al. | |
| 6,952,040 B2 | 10/2005 | Chau et al. | |
| 6,974,729 B2 * | 12/2005 | Collaert et al. | 438/157 |
| 6,974,764 B2 | 12/2005 | Brask et al. | |
| 6,998,686 B2 | 2/2006 | Chau et al. | |

(Continued)

OTHER PUBLICATIONS

Chau, Robert S., et al., "High Mobility Tri-Gate Devices and Methods of Fabrication", U.S. Patent Application Filed Jan. 12, 2006 assigned U.S. Appl. No. 11/332,189.

(Continued)

*Primary Examiner* — Matthew Landau
*Assistant Examiner* — Jessica Hall
(74) *Attorney, Agent, or Firm* — Cool Patent, P.C.; Joseph P. Curtin (57) ABSTRACT

A method includes depositing a sacrificial gate electrode to one or more multi-gate fins. The sacrificial gate electrode is patterned such that it is coupled to a gate region and substantially no sacrificial gate electrode is coupled to source and drain regions. A dielectric film is formed that is coupled to the source and drain regions. The sacrificial gate electrode is removed and a spacer gate dielectric is deposited to the gate region wherein substantially no spacer gate dielectric is deposited to the source and drain regions. The spacer gate dielectric is etched to completely remove the spacer gate dielectric from the gate region area that is to be coupled with a final gate electrode except a remaining pre-determined thickness of spacer gate dielectric that is to be coupled with the final gate electrode that remains coupled with the dielectric film.

16 Claims, 3 Drawing Sheets

U.S. PATENT DOCUMENTS

| | | | |
|---|---|---|---|
| 7,005,366 | B2 | 2/2006 | Chau et al. |
| 7,037,845 | B2 | 5/2006 | Brask et al. |
| 7,042,009 | B2 | 5/2006 | Shaheen et al. |
| 7,045,428 | B2 | 5/2006 | Brask et al. |
| 7,071,064 | B2 | 7/2006 | Doyle et al. |
| 7,074,680 | B2 | 7/2006 | Doczy et al. |
| 7,084,038 | B2 | 8/2006 | Doczy et al. |
| 7,105,390 | B2 | 9/2006 | Brask et al. |
| 7,148,548 | B2 | 12/2006 | Doczy et al. |
| 7,153,734 | B2 | 12/2006 | Brask et al. |
| 7,153,784 | B2 | 12/2006 | Brask et al. |
| 7,157,378 | B2 | 1/2007 | Brask et al. |
| 7,160,767 | B2 | 1/2007 | Brask et al. |
| 7,160,779 | B2 | 1/2007 | Doczy et al. |
| 7,166,505 | B2 | 1/2007 | Arghavani et al. |
| 7,176,075 | B2 | 2/2007 | Jin et al. |
| 7,176,090 | B2 | 2/2007 | Brask et al. |
| 7,180,109 | B2 | 2/2007 | Jin et al. |
| 7,183,184 | B2 | 2/2007 | Doczy et al. |
| 7,208,361 | B2 | 4/2007 | Shah et al. |
| 7,220,635 | B2 | 5/2007 | Brask et al. |
| 7,223,679 | B2 | 5/2007 | Murthy et al. |
| 7,268,058 | B2 | 9/2007 | Jin et al. |
| 2004/0007724 | A1 | 1/2004 | Murthy et al. |
| 2004/0036126 | A1 | 2/2004 | Chau et al. |
| 2005/0269644 | A1 | 12/2005 | Brask et al. |
| 2005/0272191 | A1 | 12/2005 | Shah et al. |
| 2005/0287748 | A1 | 12/2005 | Kavalieros et al. |
| 2007/0029627 | A1 | 2/2007 | Datta et al. |
| 2007/0287255 | A1 | 12/2007 | Doyle et al. |
| 2008/0003755 | A1 | 1/2008 | Shah et al. |

OTHER PUBLICATIONS

Chau, Robert S., et al., "A CMOS Device With Metal and Silicide Gate Electrodes and a Method for Making It", U.S. Patent Application filed Nov. 2, 2006 assigned U.S. Appl. No. 11/556,025.

Chau, Robert S., et al., "Replacement Metal Gate/High K Dielectric Scheme for FIN-FET Transistors", U.S. Patent Application filed Nov. 21, 2007 assigned U.S. Appl. No. 11/986,510.

Kavalieros, Jack T., et al., "An Apparatus and Method for Selectively Recessing Spacers on Multi-Gate Devices", U.S. Patent Application filed Sep. 15, 2006 assigned U.S. Appl. No. 11/521,624.

Singh, Rajwinder et al., "Method of Forming a Selective Spacer in a Semiconductor Device", U.S. Patent Application filed Dec. 29, 2006 assigned U.S. Appl. No. 11/648,512.

Doyle, Brian S., et al., "Multi-Gate Structure and Method of Doping Same", U.S. Patent Application filed Mar. 28, 2006 assigned U.S. Appl. No. 11/729,198.

Rachmady, Willy et al., "High K Dielectric Materials Integrated Into Multi-Gate Transistor Structures", U.S. Patent Application filed Jun. 19, 2007 assigned U.S. Appl. No. 11/765,023.

Ban, Ibrahim et al., "Localized Spacer for a Multi-Gate Transistor", U.S. Patent Application filed Mar. 28, 2007 assigned U.S. Appl. No. 11/729,033.

* cited by examiner

Figure 1

REDUCING EXTERNAL RESISTANCE OF A MULTI-GATE DEVICE USING SPACER PROCESSING TECHNIQUES

BACKGROUND

Generally, multi-gate devices or non-planar transistors such as tri-gate devices are emerging as a viable option to support future technology scaling.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of reducing external resistance of a multi-gate device using spacer processing techniques are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
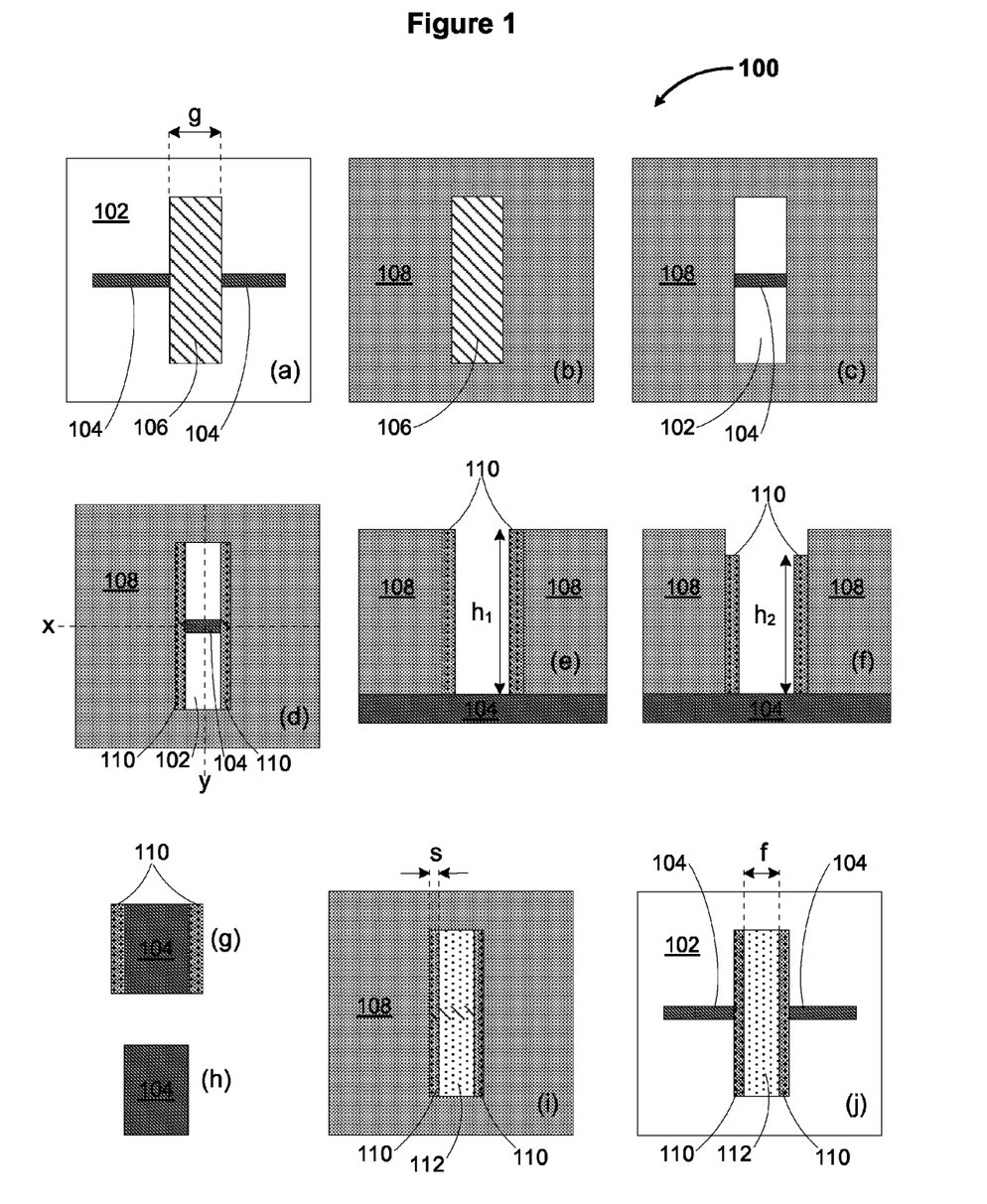
FIG. 1 is a process schematic for reducing external resistance of a multi-gate device using spacer processing techniques, according to but one embodiment.

FIG. 1 is a process schematic for reducing external resistance of a multi-gate device using spacer processing techniques, according to but one embodiment. FIGS. 1a-d and FIGS. 1i-j include top-down representations while FIGS. 1e-h include cross-section representations. Although the depictions are represented sequentially (i.e. a through j), other sequences may be readily apparent and/or may fall within the spirit and scope of this description. In other words, the description is not limited to the particular sequence depicted in FIG. 1.

Multi-gate transistors or non-planar devices 100, such as tri-gate devices, may emerge as an option to support future technology scaling of transistor devices. However, drive current in multi-gate devices may be severely hindered by parasitic resistance. The parasitic resistance may result from difficulty in forming low interfacial resistance between epitaxial growth (epi-growth) and fin 104 surfaces (i.e.—sidewalls). For example, sidewall spacer dielectric may block epi-growth along the sides of the fin 104. This may result in forming a low resistance contact only on a portion of the fin 104 that is not impeded by the spacer dielectric, for example. Such effect may bottleneck the flow of current into the fin 104, resulting in a degradation of external resistance ($R_{ext}$) of the multi-gate transistor.

In an embodiment according to FIG. 1a, an apparatus 100 includes shallow-trench isolation (STI) material 102, one or more multi-gate fins 104, and sacrificial gate electrode 106, each coupled as shown. The one or more multi-gate fins 104 may be referred to as diffusion according to an embodiment and may include doped silicon. Fin 104 may include a source region, a drain region, and a gate region, the gate region being disposed between the source and drain regions. The visible portion of fin 104 in FIG. 1a may include a source region and a drain region. The portion of fin 104 covered by the sacrificial gate electrode 106 may include a gate region (i.e.—the portion of fin 104 visible in FIG. 1c). In an embodiment, one or more multi-gate fins 104 are coupled with an underlying semiconductor substrate (not shown). The STI material 102 may be deposited to the semiconductor substrate. FIG. 1a may depict a tri-gate fin after conventional trench etch and STI isolation processes.

In an embodiment, a sacrificial gate electrode 106 is deposited to the one or more multi-gate fins 104 and patterned such that the sacrificial gate electrode 106 material is coupled to the gate region and substantially no sacrificial gate electrode is coupled to the source and drain regions of the one or more multi-gate fins 104. The dimensions of the sacrificial gate electrode 106 may be selected or pre-determined according to several factors. In an embodiment, the thickness, g, of the sacrificial gate electrode 106 in the direction of the one or more multi-gate fins 104 is equal to or about equal to the following, where f is a pre-determined final gate electrode critical dimension (CD) (see FIG. 1j) and where s is a pre-determined spacer gate dielectric thickness (see FIG. 1i)

$$g = f + 2s \qquad (1)$$

The spacer gate dielectric thickness, s, may be accounted for twice to provide for the spacer gate dielectric 110 that is to be coupled to the source side of the final gate electrode 112 and for the spacer gate dielectric 110 that is to be coupled to the drain side of the final gate electrode 112. A spacer gate dielectric thickness may be pre-determined according to size constraints of a multi-gate device, desired dielectric properties, and/or the size of other associated elements such as the final gate electrode 112, or the one or more multi-gate fins 104, for example. A final gate electrode CD may be pre-determined according to a variety of factors including size constraints of a multi-gate device, or other desired properties of a multi-gate device such as switching speed, among other factors.

In another embodiment, the height of the sacrificial gate electrode 106 is selected such that the height, $h_2$, of the remaining spacer gate dielectric 110 (see FIG. 1f) after etching the spacer gate dielectric 110 is equal to or about equal to a pre-determined height of the final gate electrode 112. For example, the height of the final gate electrode 112 may be pre-determined according to design size constraints and/or desired properties in a multi-gate device. In a top down view such as in FIG. 1a, the height of the sacrificial gate electrode 106 may be in the direction coming out of the page. In an embodiment, the height of the sacrificial gate electrode 106 determines the height of the spacer gate dielectric 110.

Etching the spacer gate dielectric 110 may reduce the height of the spacer gate dielectric 110 (see FIGS. 1e-f). Prior to the etching, the spacer gate dielectric 110 height, $h_1$, may be greater than after the etching ($h_1 > h_2$). The final gate electrode 112 height may be determined by the spacer gate dielectric 110 height, $h_2$, if the final gate electrode 112 is deposited and/or polished to match the spacer gate dielectric 110 height, $h_2$, after etching. In an embodiment, the height of the sacrificial gate electrode 106 is selected to comprehend these downstream effects. In an embodiment, a sacrificial gate electrode 106 is geometrically upsized in relation to a final gate electrode 112.

A sacrificial gate electrode 106 may include a variety of materials such as polysilicon, metal, or any other suitable gate electrode temporary placeholder for the purposes of defining a region where a final gate electrode 112 and/or spacer gate dielectric 110 are to be formed. In an embodiment, the final gate electrode 112 is a second sacrificial gate electrode to be replaced by another gate electrode material in subsequent process steps. In another embodiment, the final gate electrode 112 is incorporated in a finished multi-gate device. In other embodiments, a final gate stack includes a high-k dielectric (not shown) coupled with the fin 104 and a metal gate electrode 112 coupled with the high-k dielectric.

Other forms of processing may be performed on the structure of FIG. 1a. For example, a tip implantation may be performed on the gate structure of FIG. 1a in an embodiment. Tip implantation may include implanting the interface between the fin 104 and the sacrificial electrode 106 according to one embodiment. Implant may include p-type or n-type dopant.

In an embodiment according to FIG. 1b, an apparatus 100 includes a sacrificial gate electrode 106 coupled with a dielectric film 108, each coupled as shown. FIG. 1b may be a depiction of FIG. 1a after a dielectric film 108 has been deposited and polished. In an embodiment, dielectric film 108 includes oxide materials such as silicon oxide for example. In other embodiments, dielectric film 108 includes any suitable sacrificial material upon which spacer gate dielectric 110 material may be deposited and/or patterned. In an embodiment, a dielectric film 108 is deposited or formed such that it is coupled to the source and drain regions of the one or more multi-gate fins 104. Dielectric film 108 may be polished or planarized back to the level of a sacrificial gate electrode 106.

In an embodiment according to FIG. 1c, an apparatus 100 includes STI material 102, one or more multi-gate fins 104, and dielectric film 108, each coupled as shown. FIG. 1c may be a depiction of FIG. 1b after the sacrificial gate electrode 106 has been removed or lifted out. In an embodiment, sacrificial gate electrode 106 is removed by etching that exposes the underlying gate region of the one or more multi-gate fins 104.

In an embodiment according to FIG. 1d, an apparatus 100 includes STI material 102, one or more multi-gate fins 104, dielectric film 108, and spacer gate dielectric 110, each coupled as shown. FIG. 1d may be a depiction of FIG. 1c after deposition and etching of spacer gate dielectric 110.

Spacer gate dielectric 110 may be deposited to the gate region of one or more multi-gate fins 104. The source and drain regions of the one or more multi-gate fins 104 may be protected from spacer 110 deposition by the dielectric film 108 that covers these regions. In an embodiment, spacer 110 deposition includes conformal growth of a nitride material such as silicon nitride on at least the exposed surfaces within the area exposed after the removal of the sacrificial gate electrode 106. In an embodiment, the spacer gate dielectric 110 is conformally grown along the dielectric film 108 in contrast to a conventional process where spacer 110 is conformally grown along the gate electrode 112.

A first etch may remove the spacer 110 from the STI surface 102 and from the top (visible from top-down view in FIG. 1d) of the multi-gate fin 104, according to but one embodiment. A second etch, or over-etch process may completely remove the spacer gate dielectric 110 from the gate region area 104 to be coupled with a final gate electrode 112, except a remaining pre-determined thickness, s, of spacer gate dielectric 110 (i.e.—the two spacer films 110 visible in FIG. 1d) to be coupled with the final gate electrode 112. After over-etch, the spacer gate dielectric 110 that remains as depicted in FIG. 1d is coupled to the dielectric film 108. In another embodiment, the remaining spacer 110 is coupled to the one or more multi-gate fins 104 at an interface region between the source region and the gate region and at an interface region between the drain region and the gate region of the one or more multi-gate fins 104.

In an embodiment, a multi-gate fin 104 includes a tri-gate fin having a top surface, a first sidewall surface, and a second sidewall surface where the deposited spacer 110 is etched to the extent that it removes substantially all of the spacer 110 from the top surface, the first sidewall surface, and the second sidewall surface of the gate region area that is to be directly coupled to the final gate electrode 112. In other words, spacer 110 material is substantially or completely removed from the area of fin 104 including the top and sidewalls of fin 104 that are to be in direct contact with the final gate electrode 112 material.

According to an embodiment, no spacer gate dielectric 110 is deposited to the source and drain regions of the one or more multi-gate fins 104 at any time during a gate formation process. A gate formation process may include at least the processes described in this specification. The spacer-free source and drain regions 104 may enable lower interfacial resistance between a semiconductor material epitaxially grown (epi-growth) on the top and sidewall surfaces of the source and drain regions 104. For example, spacer 110 material does not block the epi-growth in these regions, reducing the $R_{ext}$ and improving the drive current of a multi-gate device incorporating such techniques.

In an embodiment according to FIG. 1e, an apparatus 100 includes one or more multi-gate fins 104, dielectric film 108, and spacer gate dielectric 110, each coupled as shown. FIG. 1e may be a cross-section depiction of FIG. 1d along line x, at the intersection of line x and line y. In an embodiment, a spacer gate dielectric 110 has a height, $h_1$, prior to over-etching. In an embodiment according to FIG. 1f, which may be a depiction of FIG. 1e after over-etching, the spacer gate dielectric 110 height, $h_2$, has been reduced in comparison to $h_1$ as a result of etching. In an embodiment, FIGS. 1e-f depict spacer gate dielectric 110 conformally grown along a dielectric film 108.

In an embodiment according to FIG. 1g, an apparatus 100 includes a multi-gate fin 104 and spacer gate dielectric 110, each coupled as shown. FIG. 1g may be a cross-section depiction of FIG. 1d along line y at the intersection of line x and line y. In an embodiment, a multi-gate fin 104 has spacer gate dielectric 110 coupled to the sidewalls prior to an over-etch process that removes the spacer gate dielectric from the sidewalls, as depicted in FIG. 1h. In an embodiment according to FIG. 1h, spacer gate dielectric is removed or substantially removed from the multi-gate fin 104 sidewalls in the gate region.

In an embodiment, FIG. 1g depicts a tri-gate fin 104 having spacer 110 coupled to a first sidewall and to a second sidewall, wherein the top surface of the tri-gate fin 104 is not coupled directly to spacer 110. The lack of spacer on the top surface may be due to an etch process that is selective to removing spacer from surfaces along the same plane as the top surface of tri-gate fin 104. FIG. 1h may depict a tri-gate fin after over-etch removes spacer 110 from the sidewalls in the gate region at the intersection of lines x and y of FIG. 1d.

In an embodiment according to FIG. 1i, an apparatus 100 includes dielectric film 108, spacer gate dielectric 110, and final gate electrode 112, each coupled as shown. FIG. 1i may be a depiction of FIG. 1d after deposition of a final gate electrode 112 and planarization of the final gate electrode. The spacer gate dielectric 110 may have a thickness, s, which may be a pre-determined thickness as already described. In an embodiment, final gate electrode 112 is grown to a height about equal to the height, $h_2$, of the spacer 110. In an embodiment, the final gate electrode 112 is planarized back to reach a desired final gate electrode height.

In an embodiment according to FIG. 1j, an apparatus 100 includes STI material 102, one or more multi-gate fins 104, spacer gate dielectric 110, and final gate electrode 112, each coupled as shown. FIG. 1j may be a depiction of FIG. 1i after oxide 108 has been removed. In an embodiment, an etching process removes oxide 108. A conventional replacement metal gate process flow may be used to further process apparatus 100.

In an embodiment, an apparatus 100 includes a semiconductor substrate, at least one multi-gate fin 104 coupled with the semiconductor substrate, the multi-gate fin including a gate region, a source region, and a drain region, the gate region being disposed between the source and drain regions. In an embodiment, an apparatus 100 further includes epitaxially grown semiconductor material (epi-growth) coupled to the source and drain regions of the multi-gate fin 104 (i.e.—the visible portions of multi-gate fin 104 in FIG. 1j). In an embodiment, lack of spacer 110 on the source and drain regions enables lower interfacial resistance between the epi-growth and the multi-gate fin 104. A gate electrode 112 may be further coupled with the gate region of the multi-gate fin 104, where a spacer gate dielectric 110 is coupled to the gate electrode 112 such that substantially no spacer gate dielectric 110 is disposed between the gate electrode 112 and the one or more multi-gate fins 104 in the gate region. In an embodiment, the semiconductor substrate includes silicon, the multi-gate fin 104 includes silicon, the gate electrode includes polysilicon, and the spacer gate dielectric includes a nitride material.

In an embodiment, an apparatus 100 is a non-planar trigate transistor including one or more multi-gate fins 104 that utilizes a spacer patterning process as described herein. Such apparatus 100 may be processed such that sacrificial gate electrode 106 patterning is geometrically upsized to allow for inclusion of spacer 110 along the final gate electrode 112. In an embodiment, the sacrificial gate electrode 106 is sufficiently tall to allow for spacer 110 over-etch to remove spacer 110 material from along the sidewalls of the fin 104 in the gate-defined region. An apparatus 100 may include spacer 110 that grows conformally along a deposited material 108 such as oxide, for example, rather than a gate electrode material 112 such as polysilicon or metal, for example. In an embodiment, an apparatus 100 includes sidewalls along the fin 104 that never encounter spacer deposition in the contact area (i.e.—source and drain regions). Such apparatus 100 may demonstrate significantly reduced $R_{ext}$ due to improved epi-growth to fin 104 resistance on the sidewalls of the fin 104, resulting from no spacer 110 along the fin 104 sidewall in the contact area.

In an embodiment, an apparatus 100 includes a multi-gate fin 104 having a top surface, a first sidewall surface, and a second sidewall surface wherein the source and drain regions have epi-growth on the top surface, the first sidewall surface, and the second sidewall surface. Coupling epi-growth to the fin 104 surfaces in the source and drain region may reduce $R_{ext}$ in a multi-gate transistor device. In an embodiment, epi-growth is epitaxially deposited to substantially the entire top, first sidewall, and second sidewall surfaces in the source and drain regions. In another embodiment, the first sidewall surface, and the second sidewall surface of the source and drain regions are substantially free of the spacer gate dielectric 110 material. In yet another embodiment, the source and drain regions of the multi-gate fin 104 are not coupled directly to the spacer gate dielectric 110 material at any time during the spacer gate dielectric 110 formation process.

Figure 2:
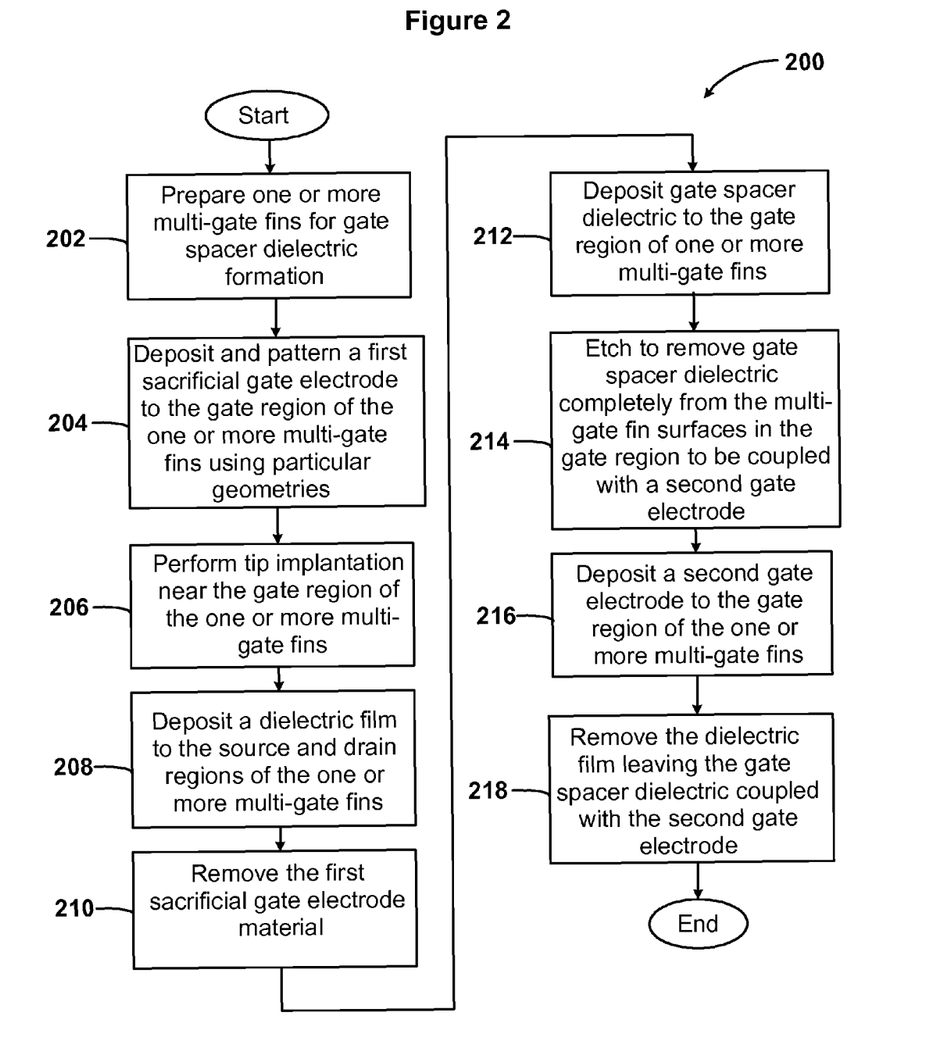
FIG. 2 is a flow diagram of a method for reducing external resistance of a multi-gate device using spacer processing techniques, according to but one embodiment.

FIG. 2 is a flow diagram of a method for reducing external resistance of a multi-gate device using spacer processing techniques, according to but one embodiment. In an embodiment, a method 200 includes preparing one or more multi-gate fins for gate spacer dielectric formation at box 202, depositing and patterning a first sacrificial gate electrode to the gate region of the one or more multi-gate fins using particular geometries at box 204, performing tip implantation near the gate region of the one or more multi-gate fins at box 206, depositing a dielectric film to the source and drain regions of the one or more multi-gate fins at box 208, removing the first sacrificial gate electrode material at box 210, depositing gate spacer dielectric to the gate region of one or more multi-gate fins at box 212, etching to remove gate spacer dielectric completely from the multi-gate fin surfaces in the gate region to be coupled with a second gate electrode at box 214, depositing a second gate electrode to the gate region of the one or more multi-gate fins at box 216, and removing the dielectric film leaving the gate spacer dielectric coupled with the second gate electrode at box 218, where arrows provide but one suggested flow.

In an embodiment, a method includes depositing a sacrificial gate electrode to one or more multi-gate fins 204, the one or more multi-gate fins including a gate region, a source region, and a drain region, the gate region being disposed between the source and drain regions, and patterning the sacrificial gate electrode such that the gate electrode material is coupled to the gate region and substantially no sacrificial gate electrode is coupled to the source and drain regions of the one or more multi-gate fins 204. In another embodiment, a method 200 further includes forming a dielectric film coupled to the source and drain regions of the one or more multi-gate fins 208 and removing the sacrificial gate electrode from the gate region of the one or more multi-gate fins 210.

A method 200 may further include depositing spacer gate dielectric to the gate region of the one or more multi-gate fins 212 where substantially no spacer gate dielectric is deposited to the source and drain regions of the one or more multi-gate fins, the source and drain regions being protected by the dielectric film. In an embodiment, a method 200 further includes etching the spacer gate dielectric to completely remove the spacer gate dielectric from the gate region area to be coupled with a final gate electrode 214, except a remaining pre-determined thickness of spacer gate dielectric to be coupled with the final gate electrode that remains coupled with the dielectric film. The remaining spacer gate dielectric may be the spacer gate dielectric 110 of FIG. 1j. The gate region area to be coupled with a final gate electrode may be the region of multi-gate fin 104 coupled to gate electrode 112 in FIG. 1j.

In an embodiment, the one or more multi-gate fins include at least one tri-gate fin having a top surface, a first sidewall surface, and a second sidewall surface where etching the spacer gate dielectric 214 substantially or completely removes the spacer gate dielectric from the top surface, the first sidewall surface, and the second sidewall surface of the gate region area to be coupled with the final gate electrode.

In an embodiment, patterning the sacrificial gate electrode 204 results in a thickness, g, of the sacrificial gate electrode in the direction of the one or more multi-gate fins that comports with the relationship described in equation (1). In another embodiment, the height of the sacrificial gate electrode is selected during patterning 204 such that a height of the remaining spacer gate dielectric after etching the spacer gate dielectric 214 is equal to or about equal to a pre-determined height of the final gate electrode, wherein etching the spacer gate dielectric 214 reduces the height of the remaining spacer gate dielectric. Forming a dielectric film 208 may include depositing an oxide material to the sacrificial gate electrode and the source and drain regions of the one or more multi-gate fins, and polishing the oxide material back to the level of the sacrificial gate electrode.

Depositing spacer gate dielectric 212 to the gate region of the one or more multi-gate fins includes conformally growing a nitride material onto the deposited dielectric film while not conformally growing spacer gate dielectric onto a gate electrode material. In another embodiment, substantially no spacer gate dielectric is deposited to the source and drain regions of the one or more multi-gate fins at any time during a gate formation process.

In other embodiments, a method 200 includes performing tip implantation 206 prior to forming a dielectric film 208, depositing the final gate electrode to the gate region of the one or more multi-gate fins 216 such that the final gate electrode is coupled to the pre-determined thickness of spacer gate dielectric that remains after etching the spacer gate dielectric, and removing the dielectric film 218 such that the pre-determined thickness of spacer gate dielectric remains coupled to the deposited final gate electrode. A method 200 may include epitaxially depositing a semiconductor material (i.e.—epi or epigrowth) to a top surface, a first sidewall surface and a second sidewall surface of the source and drain regions of one or more multi-gate fins to reduce $R_{ext}$ in a multi-gate transistor device.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 3:
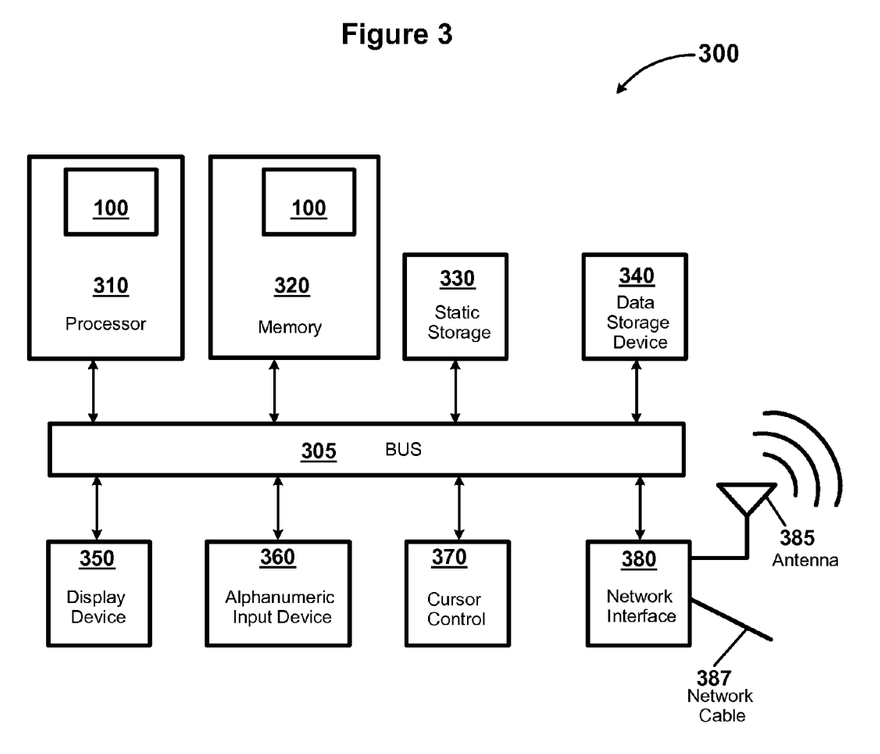
FIG. 3 is a diagram of an example system in which embodiments of the present invention may be used, according to but one embodiment.

FIG. 3 is a diagram of an example system in which embodiments of the present invention may be used, according to but one embodiment. System 300 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 300 includes an apparatus made using spacer processing techniques 100 in accordance with embodiments described with respect to FIGS. 1-2. In an embodiment, an apparatus made using spacer processing techniques 100 as described herein is part of an electronic system's processor 310 or memory 320.

Electronic system 300 may include bus 305 or other communication device to communicate information, and processor 310 coupled to bus 305 that may process information. While electronic system 300 may be illustrated with a single processor, system 300 may include multiple processors and/or co-processors. In an embodiment, processor 310 includes an apparatus made using spacer processing techniques 100 in accordance with embodiments described herein. System 300 may also include random access memory (RAM) or other storage device 320 (may be referred to as memory), coupled to bus 305 and may store information and instructions that may be executed by processor 310.

Memory 320 may also be used to store temporary variables or other intermediate information during execution of instructions by processor 310. Memory 320 is a flash memory device in one embodiment. In another embodiment, memory 320 includes an apparatus made using spacer processing techniques 100 as described herein.

System 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled with electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate information and command selections to processor 310 and to control cursor movement on display 350.

Electronic system 300 further may include one or more network interfaces 380 to provide access to network, such as a local area network. Network interface 380 may include, for example, a wireless network interface having antenna 385, which may represent one or more antennae. Network interface 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface 380 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 380 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In an embodiment, a system 300 includes one or more omnidirectional antennae 385, which may refer to an antenna that is at least partially omnidirectional and/or substantially omnidirectional, and a processor 310 coupled to communicate via the antennae.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. A method, comprising:
   depositing a sacrificial gate electrode directly on one or more fin structures, the one or more fin structures comprising a top surface, a first sidewall surface and a second sidewall surface, the sacrificial gate electrode directly coupling to the top surface, first sidewall surface and second sidewall surface of the one or more fin structures, the one or more fin structures further comprising portions that will become a gate region, a source region, and a drain region when the one or more fin structures are formed into one or more multi-gate fins, the gate region being disposed between the source and drain regions;
   patterning the sacrificial gate electrode such that the sacrificial gate electrode material is coupled to the top surface, first sidewall surface and second sidewall surface in the gate region of the one or more fin structures and substantially no sacrificial gate electrode is coupled to the top surface, first sidewall surface and second sidewall surface in the source and drain regions of the one or more fin structures;
   forming a dielectric film coupled to the source and drain regions of the one or more fin structures;
   removing the sacrificial gate electrode from the gate region of the one or more fin structures;
   depositing spacer gate dielectric to the gate region of the one or more fin structures wherein substantially no spacer gate dielectric is deposited to the source and drain regions of the one or more fin structures, the source and drain regions being protected by the dielectric film; and
   etching the spacer gate dielectric to completely, or nearly completely, remove the spacer gate dielectric from the gate region area to be coupled with a final gate electrode except a remaining pre-determined thickness of spacer gate dielectric to be coupled with the final gate electrode that remains coupled with the dielectric film.

2. A method according to claim 1, wherein patterning the sacrificial gate electrode results in a thickness, g, of the sacrificial gate electrode in the direction of the one or more fin structures that is equal to or about equal to the following, where f is a pre-determined final gate electrode critical dimension (CD) and where s is the pre-determined spacer gate dielectric thickness:

$g=f+2s.$

3. A method according to claim 1, wherein a height of the sacrificial gate electrode is selected such that a height of the remaining spacer gate dielectric after etching the spacer gate dielectric is equal to or about equal to a pre-determined height of the final gate electrode, wherein etching the spacer gate dielectric reduces the height of the remaining spacer gate dielectric.

4. A method according to claim 1, wherein forming a dielectric film comprises:
   depositing an oxide material to the sacrificial gate electrode and the source and drain regions of the one or more fin structures; and
   polishing the oxide material back to the level of the sacrificial gate electrode.

5. A method according to claim 1, wherein depositing spacer gate dielectric to the gate region of the one or more fin structures comprises conformally growing a nitride material onto the deposited dielectric film while not conformally growing spacer gate dielectric onto the sacrificial gate electrode material and not conformally growing spacer gate dielectric onto the final gate electrode material.

6. A method according to claim 1, wherein substantially no spacer gate dielectric is deposited to the source and drain regions of the one or more fin structures at any time during a gate formation process.

7. A method according to claim 1, wherein the one or more fin structures comprise at least one tri-gate fin, the tri-gate fin having the top surface, the first sidewall surface, and the second sidewall surface wherein etching the spacer gate dielectric substantially removes the spacer gate dielectric from the top surface, the first sidewall surface, and the second sidewall surface of the gate region area to be coupled with the final gate electrode.

8. A method according to claim 1, further comprising:
   performing tip implantation prior to forming a dielectric film;
   depositing the final gate electrode to the gate region of the one or more fin structures such that the final gate electrode is coupled to the pre-determined thickness of spacer gate dielectric that remains after etching the spacer gate dielectric; and
   removing the dielectric film such that the pre-determined thickness of spacer gate dielectric remains coupled to the deposited final gate electrode.

9. A method according to claim 8, wherein patterning the sacrificial gate electrode results in a thickness, g, of the sacrificial gate electrode in the direction of the one or more multi-gate fins that is equal to or about equal to the following, where f is a pre-determined final gate electrode critical dimension (CD) and where s is the pre-determined spacer gate dielectric thickness:

$g=f+2s.$

10. A method according to claim 9, wherein a height of the sacrificial gate electrode is selected such that a height of the remaining spacer gate dielectric after etching the spacer gate dielectric is equal to or about equal to a pre-determined height of the final gate electrode, wherein etching the spacer gate dielectric reduces the height of the remaining spacer gate dielectric.

11. A method according to claim 10, wherein forming a dielectric film comprises:
   depositing an oxide material to the sacrificial gate electrode and the source and drain regions of the one or more fin structures; and
   polishing the oxide material back to the level of the sacrificial gate electrode.

12. A method according to claim 11, wherein depositing spacer gate dielectric to the gate region of the one or more fin structures comprises conformally growing a nitride material onto the deposited dielectric film while not conformally growing spacer gate dielectric onto the sacrificial gate electrode material and not conformally growing spacer gate dielectric onto the final gate electrode material.

13. A method according to claim 12, wherein substantially no spacer gate dielectric is deposited to the source and drain regions of the one or more fin structures at any time during a gate formation process.

14. A method according to claim 13, further comprising forming the one or more fin structures before depositing the sacrificial gate electrode to one or more fin structures.

15. A method according to claim 1, wherein the one or more fin structures each have the top surface, the first sidewall surface, and the second sidewall surface, the method further comprising:
   epitaxially depositing a semiconductor material to the top surface, the first sidewall surface, and the second sidewall surface of the source and drain regions of the one or more fin structures reduce external resistance ($R_{ext}$) in a multi-gate transistor device.

16. A method according to claim 1, further comprising forming the one or more fin structures before depositing the sacrificial gate electrode to one or more fin structures.

* * * * *